US011770124B2

(12) United States Patent
Flores et al.

(10) Patent No.: US 11,770,124 B2
(45) Date of Patent: *Sep. 26, 2023

(54) INTEGRATED CIRCUIT WITH HIGH-SPEED CLOCK BYPASS BEFORE RESET

(71) Applicant: TEXAS INSTRUMENTS INCORPORATED, Dallas, TX (US)

(72) Inventors: Jose Luis Flores, Richardson, TX (US); Venkateswar Reddy Kowkutla, Allen, TX (US); Ramakrishnan Venkatasubramanian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/514,664

(22) Filed: Oct. 29, 2021

(65) Prior Publication Data

US 2022/0103179 A1 Mar. 31, 2022

Related U.S. Application Data

(63) Continuation of application No. 17/078,708, filed on Oct. 23, 2020, now Pat. No. 11,196,424.
(Continued)

(51) Int. Cl.
*H03L 7/08* (2006.01)
*H03K 19/20* (2006.01)
(Continued)

(52) U.S. Cl.
CPC .............. *H03L 7/0802* (2013.01); *G06F 1/08* (2013.01); *G06F 1/10* (2013.01); *H03K 5/00* (2013.01);
(Continued)

(58) Field of Classification Search
CPC ....... H03L 7/0802; H03L 7/0814; H03L 7/00; H03L 7/085; H03L 7/087; H03L 7/0995;
(Continued)

(56) References Cited

U.S. PATENT DOCUMENTS 5,133,064 A 7/1992 Hotta et al.
6,201,448 B1 * 3/2001 Tam .......................... H03L 7/06
331/25
(Continued)

OTHER PUBLICATIONS

Notification of Transmittal of the International Search Report and the Written Opinion of the International Searching Authority, or the Declaration; PCT/US2020/067265; dated Apr. 8, 202; 11 pages.

*Primary Examiner* — John W Poos
(74) *Attorney, Agent, or Firm* — Brian D. Graham; Frank D. Cimino (57) ABSTRACT

An integrated circuit includes: a clock domain having a clock domain input; and clock management logic coupled to the clock domain. The clock management logic includes: a PLL having a reference clock input and a PLL clock output; a divider having a divider input and a divider output, the divider input coupled to the PLL clock output; and bypass logic having a first clock input, a second clock input, a bypass control input, and a bypass logic output, the first clock input coupled to divider output, the second clock input coupled to the reference clock input, and the bypass logic output coupled to the clock domain input. The bypass logic selectively bypasses the PLL and divider responsive to a bypass control signal triggered by a reset signal. The reset signal also triggers a reset control signal delayed relative to the bypass control signal.

19 Claims, 6 Drawing Sheets

Related U.S. Application Data (60) Provisional application No. 62/956,396, filed on Jan. 2, 2020.

(51) Int. Cl.
*H03K 5/00* (2006.01)
*G06F 1/10* (2006.01)
*G06F 1/08* (2006.01)

(52) U.S. Cl.
CPC ... *H03K 19/20* (2013.01); *H03K 2005/00013* (2013.01)

(58) Field of Classification Search
CPC .. H03L 7/08; H03L 7/18; H03K 5/135; H03K 5/133; H03K 5/1252; H03K 19/20; H03K 5/00; H03K 2005/00013; G06F 1/08; G06F 1/12; G06F 1/10; G06F 1/24; G06F 1/04; G06F 1/3237; G06F 1/06; G06F 1/3296; G06F 1/3203; H04L 7/033; H04L 7/0337; H04L 7/0331
See application file for complete search history.

(56) References Cited

U.S. PATENT DOCUMENTS

| | | | | |
|---|---|---|---|---|
| 6,704,892 | B1* | 3/2004 | Kurd | G01R 31/31725 714/E11.169 |
| 9,450,589 | B2* | 9/2016 | Feldman | H03L 7/06 |
| 2003/0076183 | A1 | 4/2003 | Tam et al. | |
| 2007/0069825 | A1* | 3/2007 | Wong | G06F 1/04 331/46 |
| 2012/0320955 | A1* | 12/2012 | Ueda | H04W 52/0274 455/500 |
| 2016/0306635 | A1* | 10/2016 | Nakajima | G06F 1/06 |

\* cited by examiner

| | WKUP MMR CTRL | |
|---|---|---|
| | RESET ON MOD_G_RESET_n | |
| | *MAIN PLL BYPASS WARMRESET* | |
| MAIN PLLS | MMR BIT DEFAULT VALUE | |
| MAIN_PLL0 (MAIN) | 1 | |
| MAIN_PLL1 (PER0) | 0 | PROVIDES CLOCKS TO RESET ISOLATED IPs |
| MAIN_PLL2 (PER1) | 0 | PROVIDES CLOCKS TO RESET ISOLATED IPs |
| MAIN_PLL3 (CPSW9G) | 0 | PROVIDES CLOCKS TO RESET ISOLATED IPs |
| MAIN_PLL4 (AUDIO) | 1 | |
| MAIN_PLL5 (VIDEO) | 1 | |
| MAIN_PLL6 (GPU) | 1 | |
| MAIN_PLL7 (C7x) | 1 | |
| MAIN_PLL8 (ARM) | 1 | |
| *MAIN_PLL9 (RESERVED)* | 1 | |
| *MAIN_PLL10 (RESERVED)* | 1 | |
| *MAIN_PLL11 (RESERVED)* | 1 | |
| MAIN_PLL12 (DDR) | 1 | |
| MAIN_PLL13 (C66) | 1 | |
| MAIN_PLL14 (PULSAR) | 1 | |
| MAIN_PLL15 (AUDIO) | 1 | |
| MAIN_PLL16 (DSS) | 0 | PROVIDES CLOCKS TO RESET ISOLATED IPs |
| MAIN_PLL17 (DSS) | 0 | PROVIDES CLOCKS TO RESET ISOLATED IPs |
| MAIN_PLL18 (DSS) | 0 | PROVIDES CLOCKS TO RESET ISOLATED IPs |
| MAIN_PLL19 (DSS) | 0 | PROVIDES CLOCKS TO RESET ISOLATED IPs |
| *MAIN_PLL20 (RESERVED)* | 0 | PROVIDES CLOCKS TO RESET ISOLATED IPs |
| *MAIN_PLL21 (RESERVED)* | 0 | PROVIDES CLOCKS TO RESET ISOLATED IPs |
| *MAIN_PLL22 (RESERVED)* | 0 | PROVIDES CLOCKS TO RESET ISOLATED IPs |
| MAIN_PLL23 (DSS) | 0 | PROVIDES CLOCKS TO RESET ISOLATED IPs |
| MAIN_PLL24 (MLB) | 1 | |
| MAIN_PLL25 (VISION) | 1 | |

| | RESET ON MOD_G_RESET_n |
|---|---|
| | *MCU PLL BYPASS WARMRESET* |
| MCU PLLs | MMR BIT DEFAULT VALUE |
| MCU_PLL0 (MCU) | 1 |
| MCU_PLL1 (PER) | 1 |
| MCU_PLL2 (CPSW) | 1 |

FIG. 6

INTEGRATED CIRCUIT WITH HIGH-SPEED CLOCK BYPASS BEFORE RESET

CROSS-REFERENCE TO RELATED APPLICATION

This application is a continuation of U.S. patent application Ser. No. 17/078,708, filed Oct. 23, 2020, which claims priority to U.S. Provisional Application No. 62/956,396, filed Jan. 2, 2020, all of which is hereby incorporated herein by reference in theft entirety.

BACKGROUND

The proliferation of electronic devices and integrated circuit (IC) technology has resulted in the commercialization of IC products. As new electronic devices are developed and IC technology advances, new IC products are commercialized. One example IC product that is needed in electronic devices is a multimedia or infotainment system-on-a-chip (SoC).

In an example infotainment SoC, there are a multitude of different clock domains and different modes of operation to save power. Examples modes of operation include a functional mode and a low power mode. Also, full reset and partial reset options are available in an example infotainment SoC, where a partial reset results in lower frequency clock signals being provided to some of the different clock domains. In the event of a synchronous reset mechanism (e.g., a partial reset), many of the clock domains consume more power during the reset interval than during the functional mode. The end result is that during the reset interval, the power consumption of the SoC could be 1.5× to 4× higher than during the functional mode. This high power consumption can trigger a power fault and/or may not comply with customer specifications for the infotainment SoC.

SUMMARY

In accordance with at least one example of the disclosure, an integrated circuit comprises: a clock domain having a clock domain input; and clock management logic coupled to the clock domain. The clock management logic includes: a PLL having a reference clock input and a PLL clock output; a divider having a divider input and a divider output, the divider input coupled to the PLL clock output; and bypass logic having a first clock input, a second clock input, a bypass control input, and a bypass logic output, the first clock input coupled to divider output, the second clock input coupled to the reference clock input, and the bypass logic output coupled to the clock domain input. The integrated circuit also comprises reset management logic having: a controller including a controller input; and delay logic coupled to the controller. The delay logic includes a reset input, a first delay logic output and a second delay logic output, the reset input configured to receive a reset signal, the first delay logic output coupled to the bypass control input, the second delay logic output coupled to the controller input. The reset management logic is configured to: provide a bypass control signal at the first reset output responsive to the reset signal; and provide a reset control signal at the second reset output responsive to the reset signal and delayed relative to the bypass control signal.

In accordance with at least one example of the disclosure, an infotainment circuit comprises: a first clock domain having a first clock domain input; a second clock domain having a second clock domain input; clock management logic coupled to the first and second clock domains. The clock management logic includes: a first PLL having a first reference clock input and a first PLL clock output; a first divider having a first divider input and a first divider output, the first divider input coupled to the first PLL clock output; a second PLL having a second reference clock input and a second PLL clock output; a second divider having a second divider input and a second divider output, the second divider input coupled to the second PLL clock output, and the second divider output coupled to the second clock domain input; and bypass logic having a first clock input, a second clock input, a bypass control input, and a bypass logic output, the first clock input coupled to first divider output, the second clock input coupled to the first reference clock input, and the bypass logic output coupled to the first clock domain input. The infotainment circuit also comprises reset management logic having: a controller including a controller input; and delay logic coupled to the controller, the delay logic including a reset input, a first delay logic output and a second delay logic output, the reset input configured to receive a reset signal, the first delay logic output coupled to the bypass control input, the second delay logic output coupled to the controller input. The reset management logic is configured to: provide a bypass control signal at the first reset output responsive to the reset signal; and provide a reset control signal at the second reset output responsive to the reset signal and delayed relative to the bypass control signal.

In accordance with at least one example of the disclosure, a system comprises: a infotainment chip; and a peripheral coupled to the infotainment chip. The infotainment chip includes: a first clock domain having a first clock domain input; a second clock domain having a second clock domain input, the second clock domain including an output pin to the peripheral; and clock management logic coupled to the first and second clock domains. The clock management logic includes: a first PLL having a first reference clock input and a first PLL clock output; a first divider having a first divider input and a first divider output, the first divider input coupled to the first PLL clock output; a second PLL having a second reference clock input and a second PLL clock output; a second divider having a second divider input and a second divider output, the second divider input coupled to the second PLL clock output; and bypass logic having a first clock input, a second clock input, a bypass control input, and a bypass logic output, the first clock input coupled to first divider output, the second clock input coupled to the first reference clock input, and the bypass logic output coupled to the first clock domain input. The infotainment chip also includes reset management logic having: a controller including a controller input; and delay logic coupled to the controller, the delay logic including a reset input, a first delay logic output and a second delay logic output, the reset input configured to receive a reset signal, the first delay logic output coupled to the bypass control input, the second delay logic output coupled to the controller input. The reset management logic is configured to: provide a bypass control signal at the first reset output responsive to the reset signal; and provide a reset control signal at the second reset output responsive to the reset signal and delayed relative to the bypass control signal.

BRIEF DESCRIPTION OF THE DRAWINGS

For a detailed description of various examples, reference will now be made to the accompanying drawings in which.

DETAILED DESCRIPTION

Described herein is an integrated circuit (IC) with a phase-locked loop (PLL) and divider bypass mechanism combined with delay of a partial reset (referred to sometimes as a warm reset). By bypassing PLLs and dividers before the partial reset is performed, the current levels of the IC during the partial reset are reduced compared to a previous partial reset technique. With the described bypass mechanism, the clock rates provided to at least some clock domains of the IC are reduced from a functional clock rate (e.g., gigahertz range) to a lower clock rate (e.g., megahertz range). As used herein, a "clock domain" refers to one or more components that use a particular functional clock rate supplied by a PLL and possibly other components (e.g., a divider). In some example embodiments, an IC includes a first set of clock domains that are affected by the bypass mechanism and a second set of clock domains that are not affected by the bypass mechanism. In some example embodiments, staggered bypass control signals are used to bypass the PLLs and dividers related to the first set of claim domains in a staggered (multi-stage) manner before the partial reset is initiated. During the partial reset, a bypass control shadow value is set in memory. Once the partial reset is complete, the bypass control shadow value is cleared in the memory and the IC is restored to its normal functions.

In an example embodiment, an IC includes: a clock domain having a clock domain input; and clock management logic coupled to the clock domain. The clock management logic includes: a PLL having a reference clock input and a PLL clock output; a divider having a divider input and a divider output, the divider input coupled to the PLL clock output; and bypass logic having a first clock input, a second clock input, a bypass control input, and a bypass logic output, the first clock input coupled to divider output, the second clock input coupled to the reference clock input, and the bypass logic output coupled to the clock domain input. The IC also includes reset management logic having: a controller including a controller input; and delay logic coupled to the controller. The delay logic includes a reset input, a first delay logic output and a second delay logic output, the reset input configured to receive a reset signal, the first delay logic output coupled to the bypass control input, the second delay logic output coupled to the controller input. The reset management logic is configured to: provide a bypass control signal at the first reset output responsive to the reset signal; and provide a reset control signal at the second reset output responsive to the reset signal and delayed relative to the bypass control signal. The described IC uses a PLL and divider bypass mechanism combined with delay of a partial reset to reduce current levels of the IC during the partial reset. To provide a better understanding, various IC options and related clock management option, reset management options, and systems are described using the figures as follows.

Figure 1:
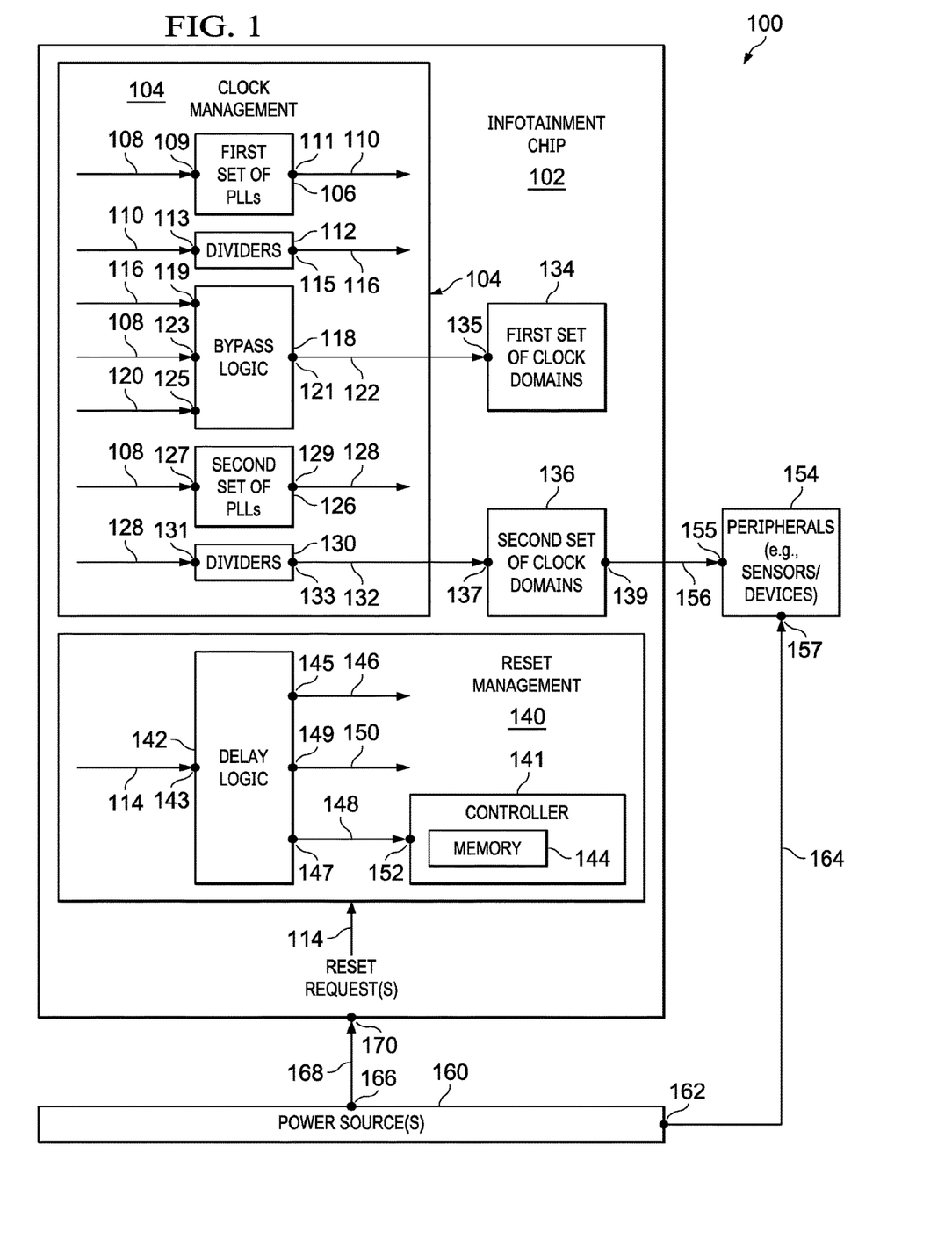
FIG. 1 is a diagram showing a system in accordance with an example embodiment.

FIG. 1 is a diagram showing a system 100 in accordance with an example embodiment. In some example embodiments, the system 100 is a vehicle with a graphical user interface (GUI) or display. As shown, the system 100 includes an infotainment chip 102 coupled to peripherals 154. Also, a power source(s) 160 having a first power output 162 and a second power output 166 is represented in the system 100, where the first power output 162 is coupled to a power input 157 of the peripherals 154 and provides power supply voltage 164. Meanwhile, the second power output 166 is coupled to a power input 170 of the infotainment chip 102 and provides power supply voltage 168 to provide power supply voltage 168. In the example of the system 100 being a vehicle, the power source(s) 160 include a battery, one or more voltage regulators, and/or a current loop.

As shown in FIG. 1, the infotainment chip 102 comprises clock management logic 104 coupled to a first set of clock domains 134 and a second set of clock domains 136. More specifically, the clock management logic 104 includes a first set of PLLs 106, a first set of dividers 112, bypass logic 118, a second set of PLLs 126, and a second set of dividers 130. In operation, the clock management logic 104 controls a clock frequency for each of the clock domains of the first and second clock domains 134 and 136. Without limitation to other embodiments, in some embodiments, the first set of PLLs 106 includes a microprocessor (MCU) PLL, an audio subsystem PLL, a video subsystem PLL, accelerator subsystem PLLs, and/or other subsystem PLLs. Also, the second set of PLLs includes one or more peripheral subsystem PLLs, an Ethernet subsystem PLL, and a display subsystem PLL configured to provide limited display functionality (e.g., information display, but no video).

In some example embodiments, each PLL of the first set of PLLs 106 includes a respective reference clock input 109 and a respective PLL clock output 111, where each reference clock input 109 receives a reference clock signal 108, and where each PLL clock output 111 provides a respective PLL clock signal 110. Also, each divider of the first set of dividers 112 includes a respective divider input 113 and a respective divider output 115, each divider input 113 of the first set of dividers 112 coupled to a respective PLL clock output 111 of the first set of PLLs 106 and configured to receive a respective PLL clock signal 110. Also, each PLL in the second set of PLLs 126 includes a respective reference clock input 127 and a respective PLL clock output 129, where each reference clock input 127 receives the reference clock signal 108, and where each PLL clock output 129 provides a respective PLL clock signal 128. Also, each divider in the second set of dividers 126 includes a respective divider input 131 and a respective divider output 133, each of the divider inputs 131 coupled to a respective PLL clock output 128 of the second set of PLLs 126 and configured to receive a respective PLL clock output 128. Also, each of the divider outputs 133 is coupled to a respective clock domain input 137 of the second set of clock domains 136 and is configured to provide a respective divided PLL clock signal 132 to each clock domain input 137. In the example of FIG. 1, the operations of the bypass logic 118 do not affect the second set of clock domains 136. Example clock domains of the second set of clock domains 136 include the peripherals 154, a display subsystem, and an Ethernet subsystem.

In some example embodiments, the second set of clock domains 136 includes clock outputs 139 coupled to clock inputs 155 of the peripherals 154, where the clock outputs 139 are configured to forward one or more clock signals 156 to the clock inputs 155 of the peripherals 154. In other words, the peripherals 154 are external components included with the second set of clock domains 136 or receiving the same clock signal(s) as one or more of the clock domains of the second set of clock domains 136.

In the example of FIG. 1, the clock management logic 104 also includes bypass logic 118 having a respective first clock input 119, a respective second clock input 123, a respective bypass control input 125, and a respective bypass logic output 121 for each PLL and divider combination associated with the first set of PLLs 106 and the first set of dividers 112. Each respective first clock input 119 is coupled to a respective divider output 115 and is configured to receive a respective divided PLL clock signal 116. Also, each respective second clock input 123 is coupled to the reference clock input 109, and each bypass logic output 121 is coupled to a respective clock domain input 135 of the first set of clock domains 134. Also, each respective bypass control input 125 is configured to receive a bypass control signal 120. In operation, the bypass logic 118 enables the first set of PLLs 106 and the first set of dividers 112 to be bypassed. When bypassed, the first set of clock domains 134 receives the reference clock signal 108 at each respective clock domain input 135. When not bypassed, the first set of clock domains 134 receives a respective divided PLL clock signal 116 at each respective clock domain input 135. Without limitation to other example embodiments, in some examples, the first set of clock domains 134 includes a microprocessor (MCU), an audio subsystem, a video subsystem, accelerator subsystems, and/or other subsystems.

In FIG. 1, the infotainment chip 104 also includes reset management logic 140 having: a controller 141 including a controller input 152; and delay logic 142 coupled to the controller 141. More specifically, the delay logic 142 includes a reset input 143, a first delay logic output 145, a second delay logic output 147, and a third delay logic output 149. The reset input 143 is configured to receive one or more reset signals or requests 114 provided to the reset management logic 140. The first delay logic output 145 is coupled to at least some of the respective bypass control inputs 125 of the bypass logic 118, and the second delay logic output 147 is coupled to the controller input 152. In operation, the reset management logic is configured to: provide a bypass control signal 146 at the first reset output 145 responsive to the reset signal 114; and provide a reset control signal 148 at the second reset output 147 responsive to the reset signal 114 and delayed relative to the bypass control signal 146. In some example embodiments, the third delay logic output 149 is coupled to some of the respective bypass control inputs 125 of the bypass logic 118, such the first and third delay logic outputs 145 and 149 are coupled to different subsets of the respective bypass control inputs 125. In operation, the reset management logic 140 is configured to: provide a first bypass control signal 146 to the first delay logic output 145; and provide a second bypass control signal 150 to the third delay logic output 149, where the second bypass control signal 150 is delayed or staggered relative to the first bypass control signal 146.

After the bypass process is complete (after the first set of PLLs 106 and the first set of dividers 112 are bypassed), the reset control signal 148 causes the controller 141 to initiate a warm reset. During the warm reset, various warm reset operations are performed according to conventional warm reset procedures. In some example embodiments, the controller 141 includes a memory 144, where the controller 141 is configured to: store a bypass value in the memory 144 responsive to initiation of the warm reset; and clear the bypass value in the memory after the warm reset is complete. In FIG. 1, the controller 141 includes a processor, a computer-readable memory (e.g., memory 144) with instructions and values, and/or other components to perform warm reset operations. With the described clock management logic 104 and reset management logic 140, the infotainment chip 102 is able to respond to a partial reset request by: delaying the partial reset request, performing bypass operations for some clock domains of the infotainment chip 102 (using one or more bypass control signals, such as staggered bypass control signals); initiating the partial reset after the bypass operations are complete; performing partial reset operations; tracking when a partial reset condition is present or not; and ending the partial reset if the partial reset condition is not present. With the described clock management logic 104 and reset management logic 140, the current levels of the infotainment chip 102 during the partial reset are reduced compared to previous ICs.

Figure 2:
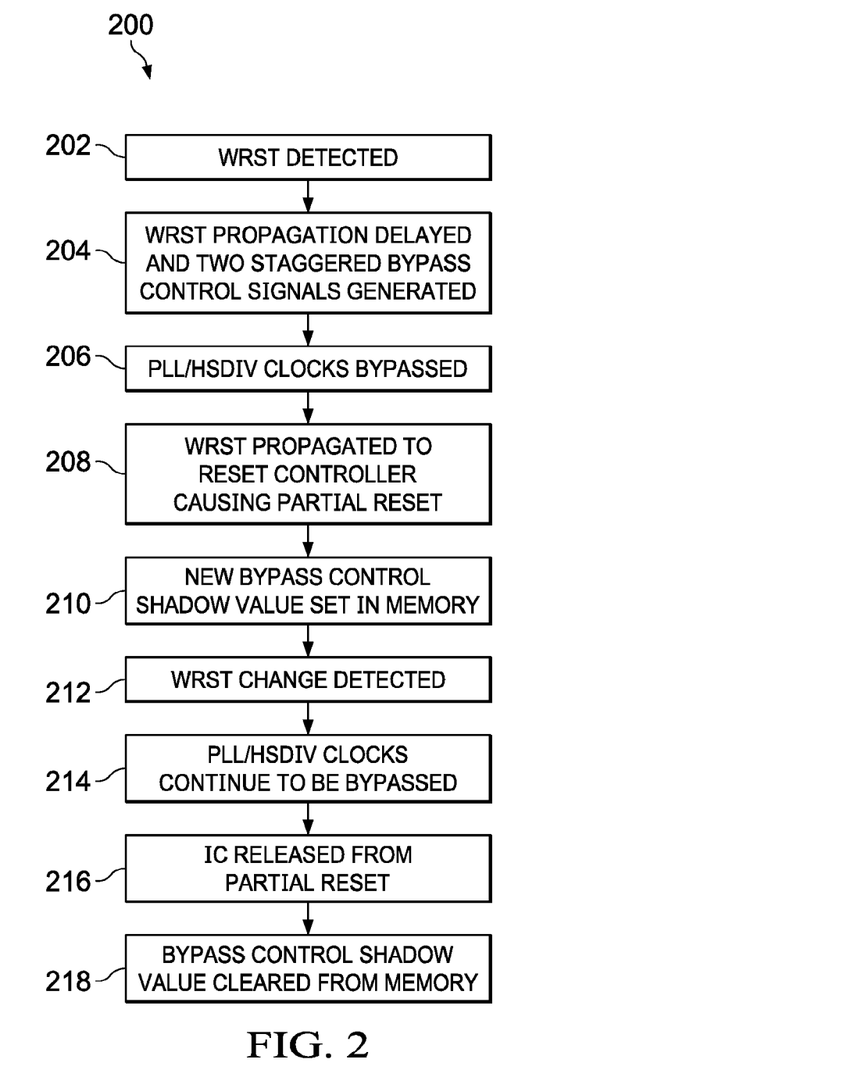
FIG. 2 is a flowchart showing a partial reset method in accordance with an example embodiment.

FIG. 2 is a flowchart showing a partial reset method 200 in accordance with an example embodiment. As shown, the partial reset method 200 includes detecting a partial reset request or signal (WRST, an example of the reset signal 114 in FIG. 1) at block 202. At block 204, propagation of WRST is delayed and two staggered bypass control signals (e.g., the bypass control signals 146 and 150 in FIG. 1) are generated. At block 206, PLL and high-speed dividers (HSDIV) clocks (e.g., from the first set of PLLs 106 and the first set of dividers 112 in FIG. 1) are bypassed using the bypass control signals. At block 208, WRST is propagated to a reset controller (e.g., the controller 141 in FIG. 1) causing a partial reset. At block 210, a new bypass control shadow value (bypass-ctrl-shadow-MMR) is set in memory. At block 212, a change to WRST is detected (e.g., WRST at its source or a related condition ends). At block 214, the PLL and HSDIV clocks continue to be bypassed. At block 216, the IC is released from the partial reset related to the WRST detected at block 202. At block 218, the bypass control shadow value is cleared from memory. As needed, the partial reset method 200 is repeated, where there are different WRST sources for the IC. Example WRST sources of an IC (e.g., the infotainment chip 102) include main reset logic, device management logic, a voltage thermal manager, and debug logic.

Figure 3:
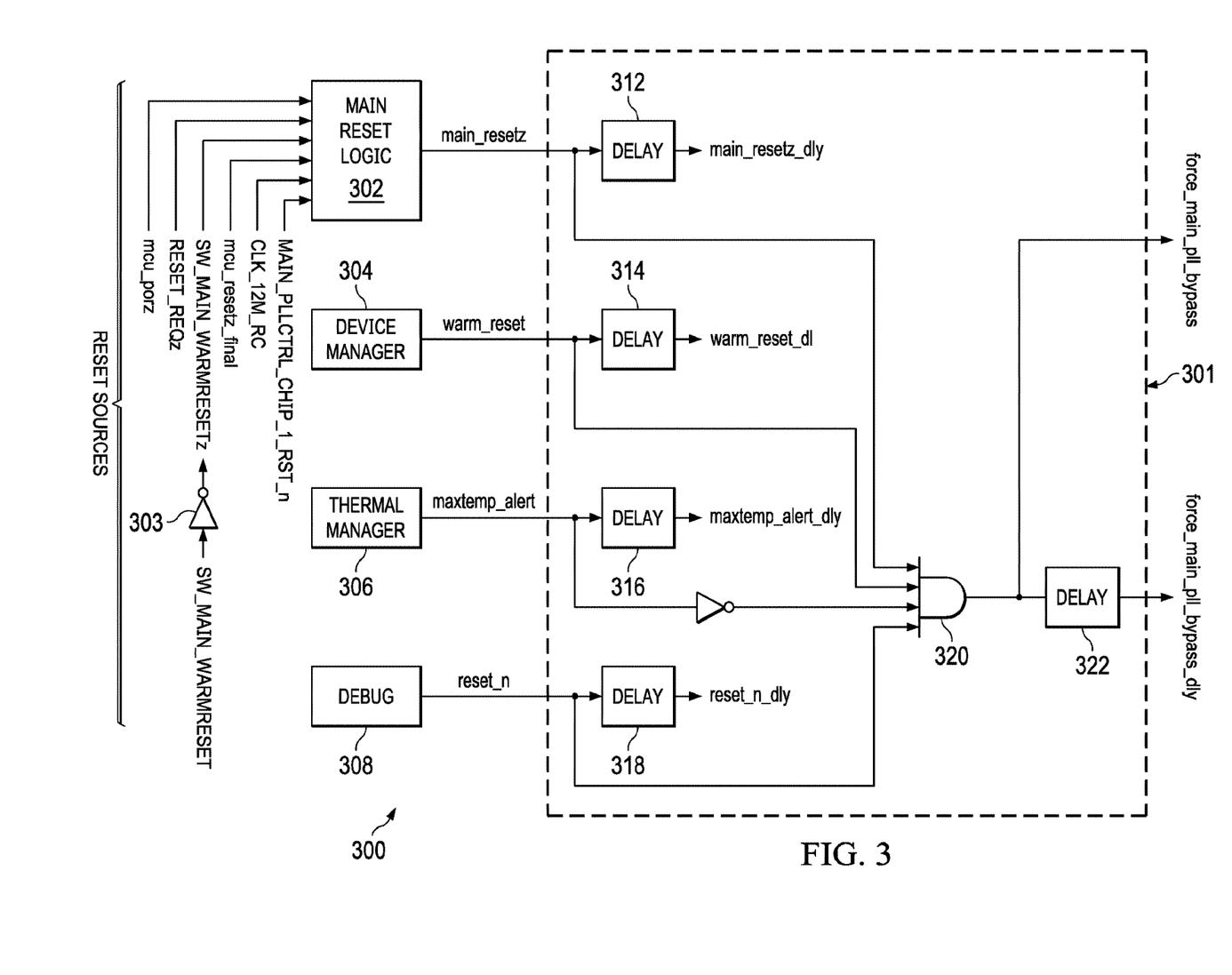
FIG. 3 is a diagram showing a reset management system in accordance with an example embodiment.

FIG. 3 is a diagram showing a reset management system 300 in accordance with an example embodiment. In FIG. 3, the reset management system 300 includes reset sources 302, 304, 306, and 306 coupled to reset management logic 301 (e.g., part of the reset management logic 140 in FIG. 1). More specifically, the reset source 302 is a main reset logic configured to receive reset requests (e.g., mcu_porz, RESET_REQz, SW_MAIN_WARMRESETz, mcu_resetz_final, CLK_12RC, MAIN_PLLCRTL_1_RST_n). As shown, SW_MAIN_WARMRESETz is an inverted signal based on another signal (SW_MAIN_WARMRESET) that is passed through an inverter 303. In response to one or more of the reset requests, the main reset logic 302 outputs a reset signal (main_resetz). The reset source 304 is a device manager configured to assert a partial reset signal (warm_reset) responsive to a related request or condition. The reset source 306 is a thermal manager 306 configured to assert a reset signal (maxtemp_alert) responsive to a overtemperature condition. The reset source 308 is debug logic configured to assert a reset signal (reset_n) responsive to debug option of an IC.

As shown, the reset management logic 301 includes delay blocks 312, 314, 316, 318 coupled to respective reset sources 302, 304, 306, and 308 and configured to receive reset signals (e.g., main_resetz, warm_reset, maxtemp_alert, and reset_n). The outputs of the delay blocks 312, 314, 316, and 318 are provided to a reset controller (e.g., the controller 141 in FIG. 1) after a delay. During the delay, the reset signals (e.g., main_resetz, warm_reset, maxtemp_alert, and reset_n) are inputs to a gate 320 configured to provide a bypass control signal ("force_main_pll_bypass", an example of the first bypass control signal 146 in FIG. 1). In some example embodiments, the reset management logic 301 also includes a delay block 322 after the gate 320, where the delay block 322 is configured to provide a bypass control signal ("force_main_pll_bypass_dly", an example of the second bypass control signal 150 in FIG. 1). In some example embodiments, force_main_pll_bypass is used to bypass some of the PLLs and dividers related to the first set of PLLs 106 and the first set of dividers 112. In one example, force_main_pll_bypass is used to bypass all PLLs and dividers related to the first set of PLLs 106 and the first set of dividers 112, except a main PLL (MAIN_PLL0) and PLLs that are partial reset isolated. After a delay, force_main_pll_bypass_dly used to bypass the main PLL and related dividers, where the bypass operations of force_main_pll_bypass and force_main_pll_bypass_dly are staggered and occur before a partial reset triggered by delayed reset signals to the reset controller is initiated.

Figure 4:
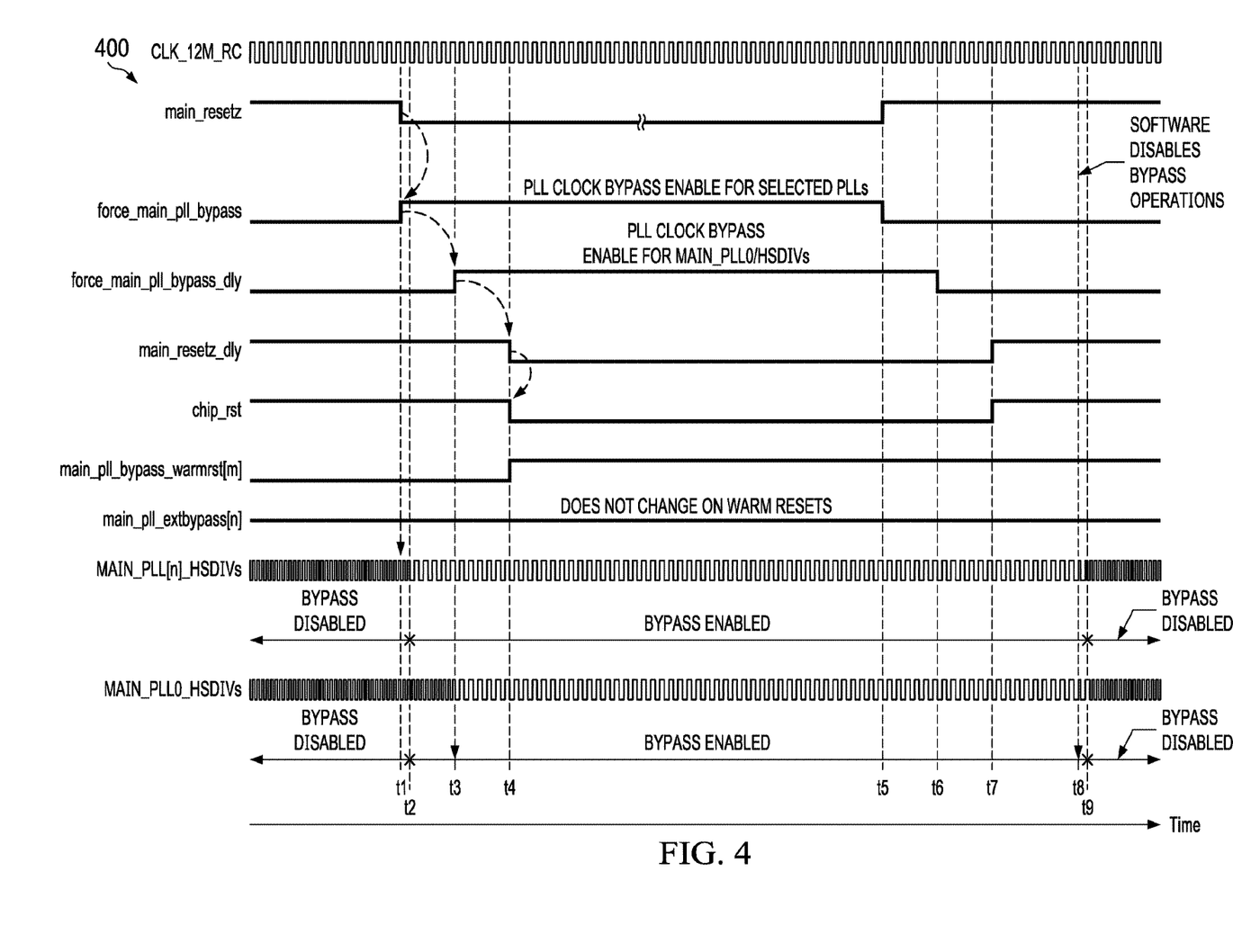
FIG. 4 is a timing diagram showing reset management and clock management signals in accordance with an example embodiment.

FIG. 4 is a timing diagram 400 showing reset management and clock management signals in accordance with an example embodiment. In the example of FIG. 4, signals are represented for a reference clock signal (CLK_12M_RC), main_resertz, force_main_pll_bypass, force_main_pll_bypass_dly, main_resertz_dly, chip_rst (e.g., from a reset controller such as controller 114 in FIG. 1), main_pll_bypass_warmrst [n] (MMR bits reset on mod_g_rst_n), main_pll_extbypass(n) (MMR bits reset on mod_por_rst_n), MAIN_PLL(n)_HSDIV, and MAIN PLL0_HSDIVs. As shown in FIG. 4, CLK_12M_RC maintains a given clock rate over time, while MAIN PLL0_HSDIVs to MAIN PLL(n)_HSDIVs vary over time depending on bypass operations as described herein. More specifically, main_resetz is deasserted at time t1. Once main_resetz is deasserted, force_main_pll_bypass is asserted to enable bypass operations for selected PLLs (e.g., processor, accelerators, non-reset isolator PLLs) starting at time t2, where the bypass operations bypass PLLs and possibly related dividers to reduce MAIN_PLL[n]_HSDIVs from a functional clock rate to a lower clock rate. At time t3, force_main_pll_bypass_dly is asserted and bypass operations are initiated for other selected PLLs (e.g., a main PLL and related dividers) to reduce MAIN_PLL0 HSDIVs from a functional clock rate to a lower clock rate as described herein. At time t4, main_resetz_dly is de-asserted, main_pll_bypass_warmrst [n] is asserted, and a partial reset (e.g., a warm reset) is initiated. Also, chip_rst is de-asserted at time t4. At time t5, main_resetz is asserted and force_main_pll_bypass is de-asserted. At time t6, force_main_pll_bypass_dly is de-asserted. At time t7, main_resetz_dly and chip_rst are asserted. At time t8, software disables bypass operations, resulting in MAIN_PLL[n]_HSDIVs and MAIN_PLL0_HSDIVs returning to their functional clock rates at t9.

Figure 5:
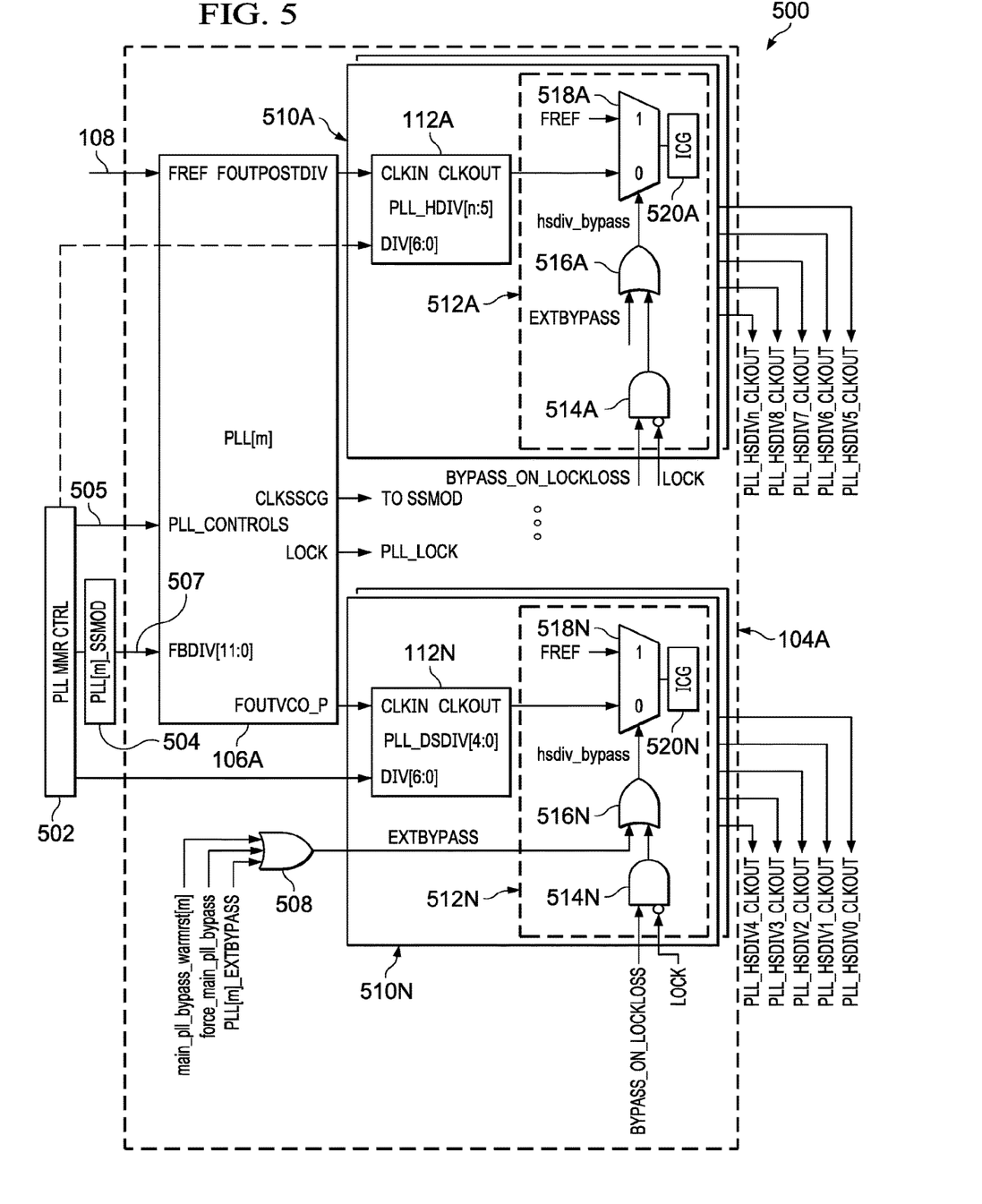
FIG. 5 is a diagram showing a clock management system in accordance with an example embodiment.

FIG. 5 is a diagram showing a clock management system 500 in accordance with an example embodiment. As shown, the clock management system 500 includes a PLL memory mapped register (MMR) controller 502 and a PLL spread spectrum modulator (SSMOD) 504 (labeled "PLL[m]_SSMOD") coupled to clock management logic 104A (an example of at least part of the clock management logic 104 in FIG. 1). In FIG. 5, the PLL MMR controller 502 provides a first control signal 505 to a control input ("PLL_CONTROLS") of the PLL 106A (labeled "PLL[m]") to enable or disable the PLL 106A. Also, the PLL SSMOD 504 provides a second control signal 507 to a control input ("FBDIV[11:0]") of the PLL 106A to adjust a feedback division value based on SSMOD operations.

In the example of FIG. 5, the clock management logic 104A includes the PLL 106A and a plurality of divider blocks 510A-510N, where each of the divider blocks 510A-510N includes a respective divider 112A-112N and respective bypass circuitry 512A-512N (the combined bypass circuitry 512A-512N is an example of the bypass logic 118 in FIG. 1). As shown, each of the bypass circuitry 512A-512N includes a respective multiplexer 518A-518N, a respective OR gate 516A-516N, and a respective AND gate 514A-514N. Also, each of the bypass circuitry 512A-512N is coupled to an OR gate 508, which provides a external bypass control signal (EXTBYPASS). As shown, the inputs to the OR gate 508 includes main_pll_bypass_warmrst[m], force_main_pll_bypass, and PLL[m]_EXTBYPASS. In the example of FIG. 5, each of the OR gates 516A-516N is configured to receive EXTBYPASS as an input. The other input of each of the OR gates 516A-516N comes from the output of each respective AND gates 514A-514N. As shown, the inputs to the respective AND gates 514A-514N includes a lock loss control signal (BYPASS_ON_LOCKLOSS, where the value at PORz=1) and a lock signal (LOCK) based on the PLL output. The output of each of the OR gates 516A-516N is a bypass control signal for each respective multiplexer 518A-518N. When the bypass control signal from the OR gates 516A-516N is low, the output from the dividers 112A-112N is output from the multiplexers 518A-518N. In some examples, a respective integrated clock gating (ICG) module 520A-520N are used at the output of each of the multiplexers 518A-518N. When bypass operations are not performed, the output of each divider block 510A-510N is based on the PLL 106A and a respective divider 112A-112N (e.g., various options are possible and are labeled PLL_HSDIV0_CLKOUT to PLL_HSDIV0_CLKOUT in FIG. 5). When bypass operations are performed (based on EXTBYPASS or based on the output of the AND gates 514A-514N), the reference clock signal (FREF) 108 input to the PLL 106A is output from the divider blocks 510A-510N. In other words, the bypass operations result in the PLL 106A and the dividers 112A-112B being bypassed such that a lower clock rate (the reference clock signal 108) is output from the divider block 510A-510N.

In the example of FIG. 5, the PLL 106A is used with a plurality of divider blocks 510A-510N. Besides the PLL clock signals output to the divider blocks 510A-510N, the PLL 106A also outputs an SSMOD control signal (from an output labeled "CLKSSCG") and a lock control signal (PLL_LOCK) from an output labeled "LOCK". In addition, in some example embodiments, all of the components in the system 500 are replicated for a given IC. In one example, an IC includes up to 20 PLLs, where each PLL has one or more related divider blocks. In addition, an IC may include PLLs and dividers without the bypass circuitry (e.g., the second set of PLLs 126 and the second set of dividers 130 in FIG. 1).

With the described clock management system 500 and reset management logic (e.g., the reset management logic 140 in FIG. 1 or the reset management system 300 in FIG. 3), an IC or infotainment chip (e.g., the infotainment circuit 102 in FIG. 1) is able to respond to a partial reset request by: delaying the partial reset request, performing bypass operations for some clock domains of the IC or infotainment chip (using one or more bypass control signals, such as staggered bypass control signals); initiating the partial reset after the bypass operations are complete; performing partial reset operations; tracking when a partial reset condition is present or not; and ending the partial reset if the partial reset condition is not present. With the described clock management system 500 and reset management logic, the current levels of the IC or infotainment chip during the partial reset are reduced compared to previous ICs.

Figure 6:
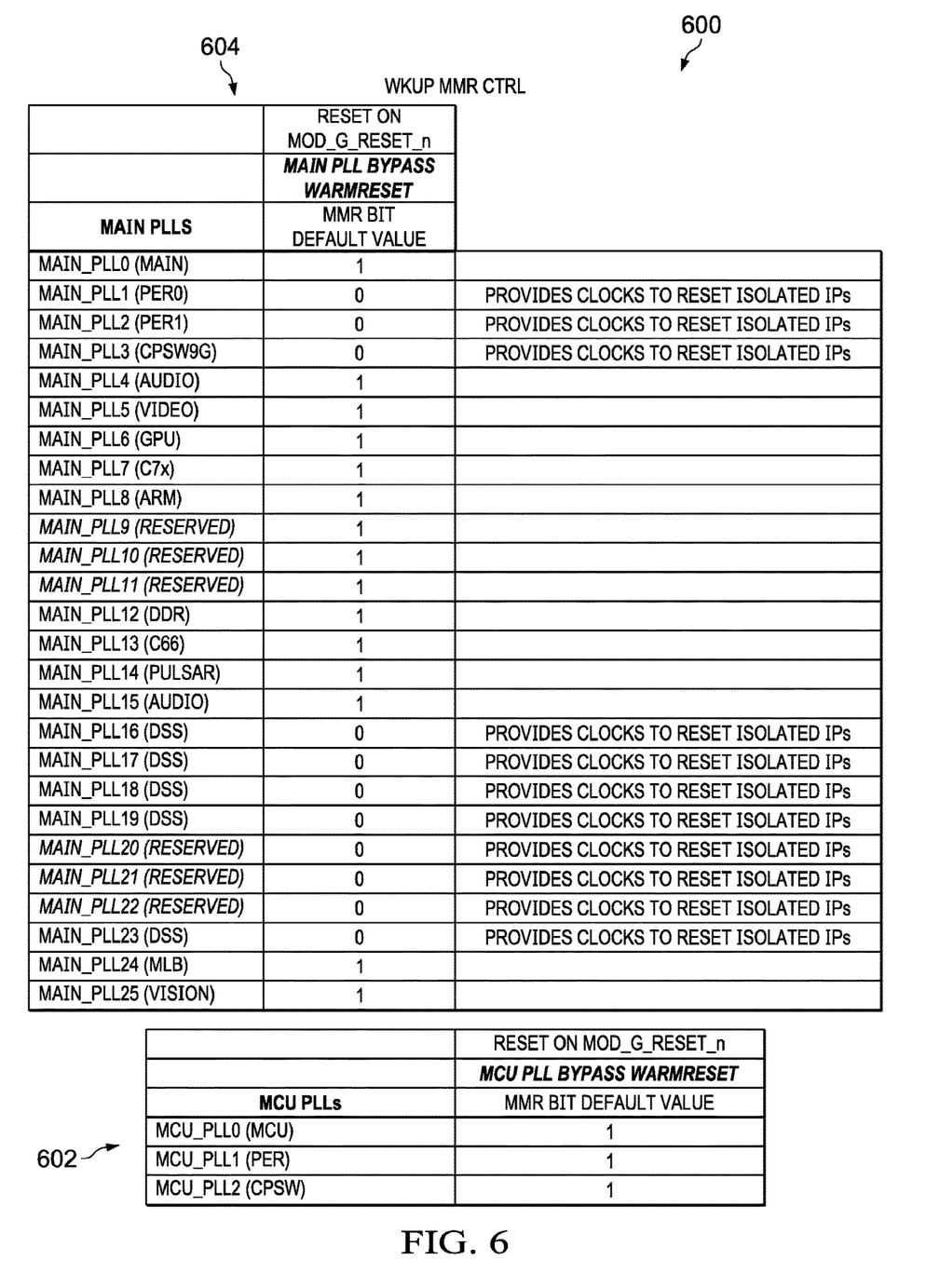
FIG. 6 are tables showing phase-locked loop (PLL) bypass options for an integrated circuit (IC) in accordance with an example embodiment.

FIG. 6 are tables 602 and 604 showing bypass options for an IC in accordance with an example embodiment. As shown, table 602 includes MCU PLLs (MCU_PLL0 to MCU_PLL2) that are bypassed by bypass operations as described herein. Also, table 604 includes various main PLLs (MAIN_PLL0 to MAIN_PLL25), where many of the main PLLs are bypassed by bypass operations (e.g., MAIN_PLL0, MAIN_PLL4 to MAIN_PLL15, MAIN_PLL24, and MAIN_PLL25). In one example, the types of main PLLs that are bypassed includes, audio subsystem PLLs, video subsystem PLLs, processor PLLs, and accelerator PLLs. Also, in table 604 there are some main PLLs that are not bypassed by bypass operations. For example, MAIN_PLL1 and MAIN_PLL2 supports peripherals and are not bypassed by bypass operations. Also, MAIN_PLL3 supports an Ethernet subsystem and is not bypassed by bypass operations. Also, MAIN_PLL16 to MAIN_PLL20 support one or more display subsystems that are not bypassed by bypass operations. The table 604 includes various reserved PLLs (e.g., MAIN_PLL9 to MAIN_PLL11 and MAIN_PLL20 to MAIN_PLL22), where MAIN_PLL9 to MAIN_PLL11 are bypassed, and where MAIN_PLL20 to MAIN_PLL22 are not bypassed. The example of FIG. 6 is for illustration only and is not intended to limit bypass operations to a particular set of PLLs. For the example given in FIG. 6, PLLs that support peripherals and external communications are not bypassed (to ensure ongoing communications with external components are possible). Also, PLLs that support a display subsystem is not bypassed (to ensure some display functionality).

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ."

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims. For example, the described embodiments refer to a partial reset scenario, where only some IC components are reset. In other example embodiments, the described clock bypass and reset delay is used for full chip reset scenarios where the chip can afford to bypass and do a full reset when a reset request is detected.

What is claimed is:

1. An integrated circuit, comprising:
   a clock domain having a clock domain input;
   a clock management circuit coupled to the clock domain, the clock management circuit including:
   a PLL having a reference clock input and a PLL clock output;
   a divider having a divider input and a divider output, the divider input coupled to the PLL clock output; and
   a bypass circuit having a first clock input, a second clock input, a bypass control input, and a bypass circuit output, the first clock input coupled to the divider output, the second clock input coupled to the reference clock input, and the bypass circuit output coupled to the clock domain input; and
   a reset management circuit that includes a controller having a controller input, wherein the reset management circuit has a reset signal input, a first reset output coupled to the bypass control input, and a second reset output coupled to the controller input.

2. The integrated circuit of claim 1, wherein:
   the reset management circuit comprises reset management logic;
   the reset signal input is configured to receive a reset signal; and
   the reset management circuit is configured to:
   provide a bypass control signal at the first reset output responsive to the reset signal; and
   provide a reset control signal at the second reset output responsive to the reset signal and delayed relative to the bypass control signal.

3. The integrated circuit of claim 2, further comprising:
   a first set of clock domains including the clock domain, each of the clock domains in the first set of clock domains having a respective clock domain input; and
   a second set of clock domains, each of the clock domains in the second set of clock domains having a respective clock domain input, the clock management circuit coupled to each respective clock domain input of the first and second sets of clock domains, and the clock management circuit including:
   a first set of PLLs including the PLL, each PLL in the first set of PLLs having a respective reference clock input and a respective PLL clock output;
   a first set of dividers, each divider in the first set of dividers having a respective divider input and a respective divider output, each divider input of the first set of dividers coupled to a respective PLL clock output of the first set of PLLs;
   a second set of PLLs, each PLL in the second set of PLLs having a respective reference clock input and a respective PLL clock output; and
   a second set of dividers, each divider in the second set of dividers having a respective divider input and a respective divider output, each divider input of the second set of dividers coupled to a respective PLL clock output of the second set of PLLs,
   the bypass circuit having a respective first clock input, a respective second clock input, a respective bypass control input, and a respective bypass output for each divider of the first set of dividers, each first clock input coupled to a respective divider output, each second clock input coupled to a respective reference clock input, each bypass output coupled to a respective clock domain input, and the first reset output of the reset management circuit coupled to each respective bypass control input.

4. The integrated circuit of claim 3, wherein the first set of PLLs includes a microprocessor (MCU) PLL and an audio subsystem PLL, and the second set of PLLs includes a peripheral subsystem PLL and a display subsystem PLL configured to display information without video.

5. The integrated circuit of claim 3, wherein the first set of PLLs includes a video subsystem PLL and the second set of PLLs includes an Ethernet subsystem PLL.

6. The integrated circuit of claim 2, wherein the bypass circuit includes:
a multiplexer having the first clock input, the second clock input, the bypass control input, and the bypass circuit output; and
an OR gate having a first gate input, a second gate input, and a gate output, the first gate input coupled to the first reset output, the second gate input configured to receive the bypass control signal, and the gate output coupled to the bypass control input.

7. The integrated circuit of claim 3, wherein the reset control signal causes the controller to initiate a warm reset after the first set of PLLs and the first set of dividers are bypassed.

8. The integrated circuit of claim 7, wherein the controller includes a memory, the controller configured to:
store a bypass value in the memory responsive to initiation of the warm reset; and
clear the bypass value in the memory after the warm reset is complete.

9. An integrated circuit comprising:
a phase-locked loop (PLL) circuit that includes an input coupled to receive a reference clock and an output, wherein the PLL circuit is configured to provide a first clock at the output of the PLL circuit based on the reference clock;
a bypass circuit that includes: a first input coupled to the output of the PLL circuit; a second input coupled to receive the reference clock; a control input; and an output;
a clock divider coupled between the PLL circuit and the bypass circuit that includes an input coupled to the output of the PLL circuit and an output coupled to the first input of the bypass circuit, wherein the clock divider is configured to provide a second clock at the output of the clock divider based on the first clock;
a set of circuits arranged in a clock domain and coupled to the output of the bypass circuit; and
a reset management circuit that includes an output coupled to the control input of the bypass circuit.

10. The integrated circuit of claim 9, wherein the bypass circuit is configured to select between providing the reference clock and the second clock at the output of the bypass circuit.

11. An integrated circuit comprising:
a phase-locked loop (PLL) circuit that includes an input coupled to receive a reference clock and an output;
a bypass circuit that includes: a first input coupled to the output of the PLL circuit; a second input coupled to receive the reference clock; a control input; and an output;
a set of circuits arranged in a clock domain and coupled to the output of the bypass circuit; and a reset management circuit that includes an output coupled to the control input of the bypass circuit, wherein:
the reset management circuit includes an input coupled to receive a reset signal; and
the reset management circuit is configured to cause the bypass circuit to provide the reference clock to the set of circuits in the clock domain in response to the reset signal.

12. The integrated circuit of claim 11, wherein:
the reset management circuit includes a controller configured to perform a reset of the set of circuits in response to the reset signal; and
the reset management circuit includes a delay circuit coupled to the controller and configured to cause the controller to perform the reset after the bypass circuit is caused to provide the reference clock.

13. The integrated circuit of claim 11, wherein:
the set of circuits is a first set of circuits;
the clock domain is a first clock domain; and
the integrated circuit further comprises a second set of circuits arranged in a clock domain and coupled to receive a clock that is independent of the reset signal.

14. The integrated circuit of claim 13, wherein:
the PLL circuit is a first PLL circuit; and
the integrated circuit further comprises:
a second PLL circuit that includes an input coupled to receive the reference clock and an output; and
a clock divider that includes an input coupled to the output of the second PLL and an output coupled to the second set of circuits to provide the clock that is independent of the reset signal.

15. A method comprising:
receiving a reference clock;
generating a first clock signal based on the reference clock;
receiving a reset signal;
selecting between providing the reference clock and the first clock signal to a set of circuits arranged in a clock domain based on the reset signal, wherein the selecting includes providing the reference clock to the set of circuits based on the reset signal being asserted; and
based on the reset signal being asserted, performing a reset operation on the set of circuits after the providing of the reference clock.

16. The integrated circuit of claim 9, wherein:
the reset management circuit includes an input coupled to receive a reset signal; and
the reset management circuit is configured to cause the bypass circuit to provide the reference clock to the set of circuits in the clock domain in response to the reset signal.

17. The integrated circuit of claim 16, wherein:
the reset management circuit includes a controller configured to perform a reset of the set of circuits in response to the reset signal; and
the reset management circuit includes a delay circuit coupled to the controller and configured to cause the controller to perform the reset after the bypass circuit is caused to provide the reference clock.

18. The integrated circuit of claim 17, wherein:
the set of circuits is a first set of circuits;
the clock domain is a first clock domain; and
the integrated circuit further comprises a second set of circuits arranged in a clock domain and coupled to receive a clock that is independent of the reset signal.

19. The integrated circuit of claim 18, wherein:
the PLL circuit is a first PLL circuit;
the clock divider is a first clock divider; and
the integrated circuit further comprises:
   a second PLL circuit that includes an input coupled to receive the reference clock and an output; and
   a second clock divider that includes an input coupled to the output of the second PLL and an output coupled to the second set of circuits to provide the clock that is independent of the reset signal.

\* \* \* \* \*